(12) United States Patent
Hofmeister et al.

(10) Patent No.: US 7,068,942 B2
(45) Date of Patent: Jun. 27, 2006

(54) SELECTION OF IC VDD FOR IMPROVED VOLTAGE REGULATION OF TRANSCIEVER/TRANSPONDER MODULES

(75) Inventors: Rudolph J. Hofmeister, Sunnyvale, CA (US); Lewis Aronson, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/684,317

(22) Filed: Oct. 13, 2003

(65) Prior Publication Data

US 2004/0085155 A1    May 6, 2004

Related U.S. Application Data

(60) Provisional application No. 60/422,680, filed on Oct. 30, 2002.

(51) Int. Cl.
*H04B 10/00* (2006.01)
*H03K 5/00* (2006.01)
(52) U.S. Cl. .................... 398/135; 324/158.1; 327/551
(58) Field of Classification Search ............ 324/158.1; 327/551; 326/80, 81; 257/528; 323/220, 323/232, 233
See application file for complete search history.

(56) References Cited

U.S. PATENT DOCUMENTS

| 5,455,501 | A | * | 10/1995 | Massie ....................... 323/267 |
| 5,528,447 | A | * | 6/1996 | McManus et al. ............ 361/56 |
| 5,705,921 | A | * | 1/1998 | Xu .............................. 323/313 |
| 5,815,354 | A | * | 9/1998 | Braceras et al. .............. 361/56 |
| 5,959,439 | A | * | 9/1999 | Shenai et al. ............... 323/222 |

* cited by examiner

*Primary Examiner*—Ernest Karlsen
(74) *Attorney, Agent, or Firm*—Workman Nydegger

(57) ABSTRACT

An integrated circuit for use at a reduced Vdd voltage. An integrated circuit is designed and implemented such that it is usable at a voltage less than an industry standard Vdd voltage. The integrated circuit may include a voltage filter that may either be implemented on the integrated circuit or external to the integrated circuit. The voltage filter receives an industry standard IC voltage and produces a filtered voltage that is that some value below the industry standard IC voltage. The voltage filter also removes noise from the industry standard IC voltage. The integrated circuit includes signal processing circuitry that is designed and implemented to improve signal quality and to operate at the filtered voltage.

10 Claims, 2 Drawing Sheets

SELECTION OF IC VDD FOR IMPROVED VOLTAGE REGULATION OF TRANSCIEVER/TRANSPONDER MODULES

CROSS-REFERENCE TO RELATED APPLICATIONS

This application claims priority to and the benefit of U.S. Provisional Patent Application No. 60/422,680, filed Oct. 30, 2002, entitled SELECTION OF IC VDD FOR IMPROVED VOLTAGE REGULATION OF TRANSCEIVER/TRANSPONDER MODULES which is incorporated herein by reference.

BACKGROUND OF THE INVENTION

1. The Field of the Invention

The present invention relates generally to methods of voltage regulation and filtering for integrated circuits used in transceivers and transponders used in fiber-optic communications.

2. The Relevant Technology

Digital data can be efficiently propagated through a fiber-optic cable using light signals from light emitting diodes or lasers. To send data on a fiber-optic cable, the data is typically converted from electronic data generated by computers to optical data that can be propagated onto the fiber-optic cable. When data is received from a fiber-optic cable, the data is converted from optical data to electronic data so that it can received by a computer.

To convert electronic data to optical data for transmission on a fiber-optic cable, a transmitting optical subassembly (TOSA) is often used. A TOSA uses the electronic data to drive a laser diode or light emitting diode to generate the optical data. When optical data is converted to electronic data, a receiving optical subassembly (ROSA) is used. The ROSA has a photo diode that, in conjunction with other circuitry, converts the optical data to electronic data. Because most computers both transmit and receive data, most computers need both a TOSA and a ROSA to communicate through fiber-optic cables. A TOSA and ROSA can be combined into an assembly generally referred to as a transceiver or a transponder.

Transceivers and transponders commonly include at least one integrated circuit (IC). Referring to FIG. 1, a transceiver or transponder module 105 is commonly mounted on a line card 120 and receives regulated power supply voltages at industry standard IC voltages from a power supply module 140 coupled to it via a backplane 130. Examples of industry standard IC voltages include 1.8 V, 3.3 V, and 5 V.

The voltage from the power supply module 140 is regulated at the power supply module 140 to within a specified tolerance. However, at the line card 120 there may be significant noise in the voltage received from the power supply module 140 through the backplane 130. This noise may be cause by noise generated at the power supply module 140 or noise coupled by the backplane 130 into the line card 120. Power supply modules commonly used are switching power supplies. Switching power supplies regulate voltage output by rapidly switching a power source on and off. This rapid switching generates noise that may be transmitted to devices powered by the switching power supply such as the line card 120. Alternatively, the backplane 130 may act as an antenna that channels noise into the line card 120.

High frequency transceiver and transponder modules increasingly include integrated circuits that are sensitive to noise. However, it is difficult to provide adequate noise filtering because filters capable of providing the requisite noise filtering drop too large a voltage for the transceiver or transponder module 105 to function properly or at all.

BRIEF SUMMARY OF THE INVENTION

One embodiment of the invention includes an integrated circuit that is used to improve electrical signals in fiber-optic communication devices. The integrated circuit includes a voltage filter within the integrated circuit. The voltage filter is configured to receive an industry standard IC voltage from an external power supply. The voltage filter generates a filtered voltage at a level that is less than the industry standard IC voltage. The integrated circuit further includes a signal processing circuit power by the filtered voltage. The signal processing circuit is designed and fabricated such that it is operable at the voltage level of the filtered voltage.

Another embodiment of the invention includes a line card for use in fiber-optic communication devices. The line card includes a connector that is configured to allow the line card to be connected to a backplane. An industry standard IC voltage may be supplied through the backplane. The line card also includes a voltage filter that is configured to receive the industry standard IC voltage. The voltage filter is configured to generate a filtered voltage that is some voltage level less than the industry standard IC voltage. The line card also includes a signal processing integrated circuit powered by the filtered voltage. The signal processing integrated circuit is designed to operate at the voltage level of the filtered voltage.

Yet another embodiment invention includes a transceiver module usable in fiber-optic communication applications. The transceiver module includes a connector that is configured to receive industry standard IC voltages. The transceiver module further includes a voltage filter residing in the transceiver module. The voltage filter is configured to receive the industry standard IC voltage. The voltage filter generates a filtered voltage a voltage level that is less than the industry standard IC voltage. The transceiver module also includes a signal processing integrated circuit powered by the filtered voltage. The signal processing integrated circuit is designed and implemented such that it is operable at the voltage level of the filtered voltage Advantageously, embodiments of the present invention implement a signal processing integrated circuit that can be used with a power supply that would ordinarily include excessive amounts of noise. By operating the integrated circuit at a voltage lower than industry standard IC power supply voltages, a voltage filter can be interposed between the power supply and the integrated circuit to provide a sufficiently stable filtered voltage to the integrated circuit.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Embodiments of the present invention allow for the use of signal processing integrated circuits in transceiver and transponder modules used in fiber-optic communications. A transceiver/transponder including certain aspects of the invention receives an industry standard IC voltage from a power supply. Such an industry standard IC voltage may be for example voltages of 1.8 V, 3.3 V or 5 V. The industry standard IC voltage passes through a voltage filter, such as for example a low drop-out (LDO) filter, to remove noise. Passing the industry standard IC voltage through a voltage filter causes a drop in voltage such that the filtered voltage is at some value below the industry standard IC voltage. This filtered voltage is nonetheless usable by the signal processing integrated circuits because the signal processing integrated circuits have been designed to operate at this reduced voltage.

Figure 1:
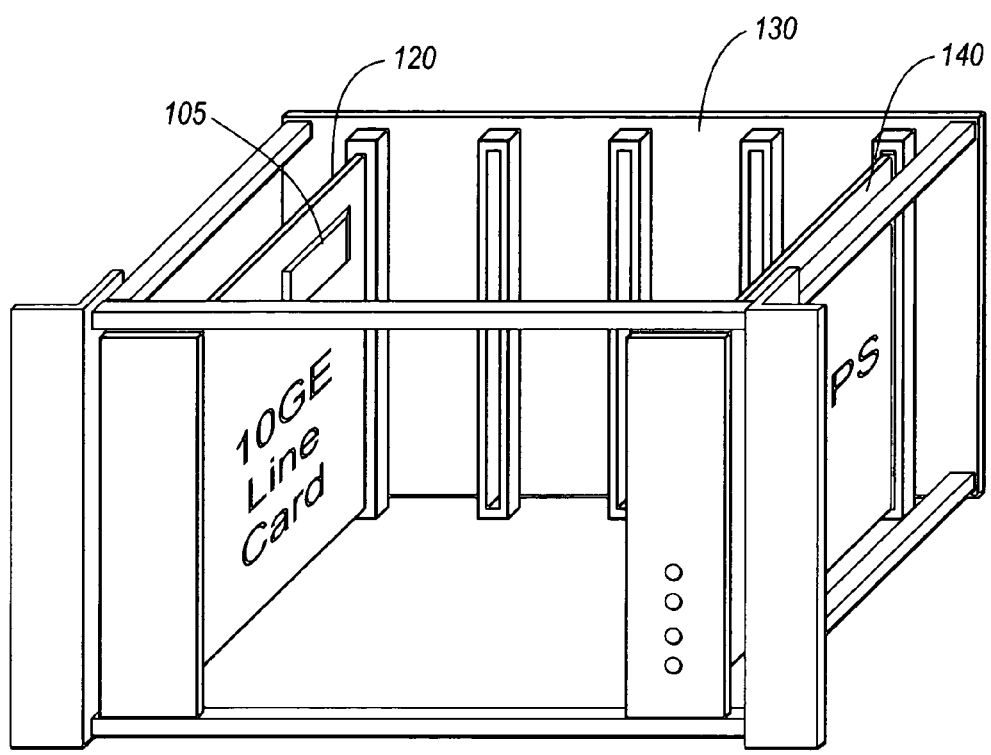
FIG. 1 is a perspective view of a transceiver line card receiving a regulated power supply voltage.
Figure 2:
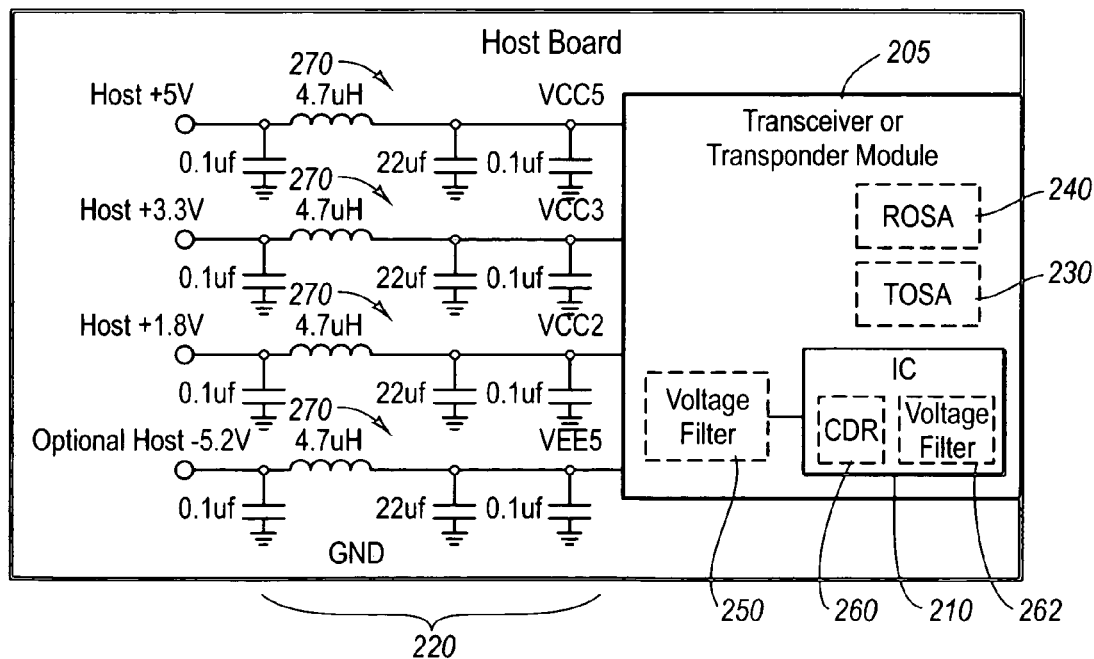
FIG. 2 illustrates a transceiver/transponder module design of the present invention.

FIG. 2 shows an embodiment of a transceiver/transponder module 205 disposed on a line card 220. The line card 220 may include a connector configured to mate with a backplane. The transceiver/transponder module 205 may, for example, include a receiver optical sub-assembly (ROSA) 240 for receiving optical signals and a transmitter optical sub-assembly (TOSA) 230 for generating optical signals. An IC 210 is included and used for various purposes. For example, and IC 210 may be used to improve the quality of electrical data signals received from ROSA 240 or electrical data signals to be coupled to TOSA 230.

In one example shown in FIG. 2, IC 210 may include a clock and data recovery (CDR) circuit 260. Some data signals in optical networks have a clock signal embedded in them when they are sent across the optical network. This clock signal can be recovered by a data system on the network using a CDR circuit 260. A phase locked loop (PLL) locks onto the data signal using the clock as a reference for times when it is appropriate to sample the data signal. In this way, the recovered clock signal is used to recover the information contained in the data signal.

Another type of circuit that may be contained on IC 210 is a circuit that performs an eye-opening function. An eye-opening circuit improves the quality of a data signal that may have been degraded by noise that has been coupled into the signal or by dispersion of the signal along a fiber-optic network.

A problem with high-speed transceivers and transponders is that circuits designed to improve the quality of electrical data signals, such as the CDR circuit 260, require a stable, low-noise chip voltage, Vdd. For example, a CDR circuit 260 may include a phase locked loop (PLL) or other circuits that are sensitive to both absolute voltage level and to noise. In particular, noise in the range of several kHz to several MHz (e.g. about 10 Khz to about 3 Mhz) may hurt circuit performance and may be difficult to adequately filter.

One or more board LC filters 270 disposed on line card 220 may provide an initial stage of voltage filtering prior to the voltage being supplied to the transceiver/transponder module 205. However, the initial stage of voltage filtering provided by LC filters 270 may be inadequate to provide the desired control of absolute voltage level and/or noise filtering required to properly operate IC 210. Consequently, in one embodiment of the present invention the transceiver/transponder module 205 includes an additional voltage filter 250 that is disposed within the transceiver/transponder module 205. The voltage filter 250 receives an input module voltage and provides a filtered voltage to power IC 210. The voltage filter 250 may comprise, for example, a passive filter, an active filter, or a low-dropout linear (LDO) filter. The voltage filter 250 is illustrated in FIG. 2 in dashed lines as a component separate from the IC 210. However, it will be understood that an active voltage filter could also be integrated onto a portion of IC the 210 as illustrated by the voltage filter 262 in dashed lines.

The voltage filter 250 or 262 disposed within the transceiver/transponder module 205 causes an additional voltage drop. For example, for a regulated power supply voltage having a nominal industry standard IC voltage level of 1.8 volts, a voltage filter 250 or 262 capable of providing adequate noise filtering for a 10 Gb/s CDR-IC may cause an additional voltage drop of about 5–10%. In this example, the actual voltage coupled to the IC 210 may be reduced by up to 0.2 volts. However, low voltage integrated circuits have tight voltage tolerances in regards to the chip operating voltage, Vdd. This is particularly true for ICs designed to operate at the industry standard IC voltage of 1.8 volts. Consequently, a conventional IC designed for a chip voltage, Vdd, of 1.8 volts may be inoperable if the voltage filter 250 or 262 is sized to provide adequate noise filtering at high data rates.

In one embodiment of the present invention a transceiver/transponder IC 210, such as an eye-opener IC, is designed to operate at a voltage level sufficiently below an industry standard IC voltage to permit a voltage filter 250 or 262 to be include in the transceiver/transponder module 205. For example, a voltage filter 250 or 262, such as a LDO filter, may be designed to receive a host voltage of 1.8 V. If the voltage filter 250 or 262 drops 0.2 V, the IC 210 is designed to operate at a reduced chip voltage, Vdd, of 1.6 volts. The on-chip operating voltage may be selected to account for the voltage drop associated with a passive filter. Conventional circuit design techniques and simulation tools may be used to optimize the IC 210 design at the reduced chip voltage Vdd.

Figure 3:
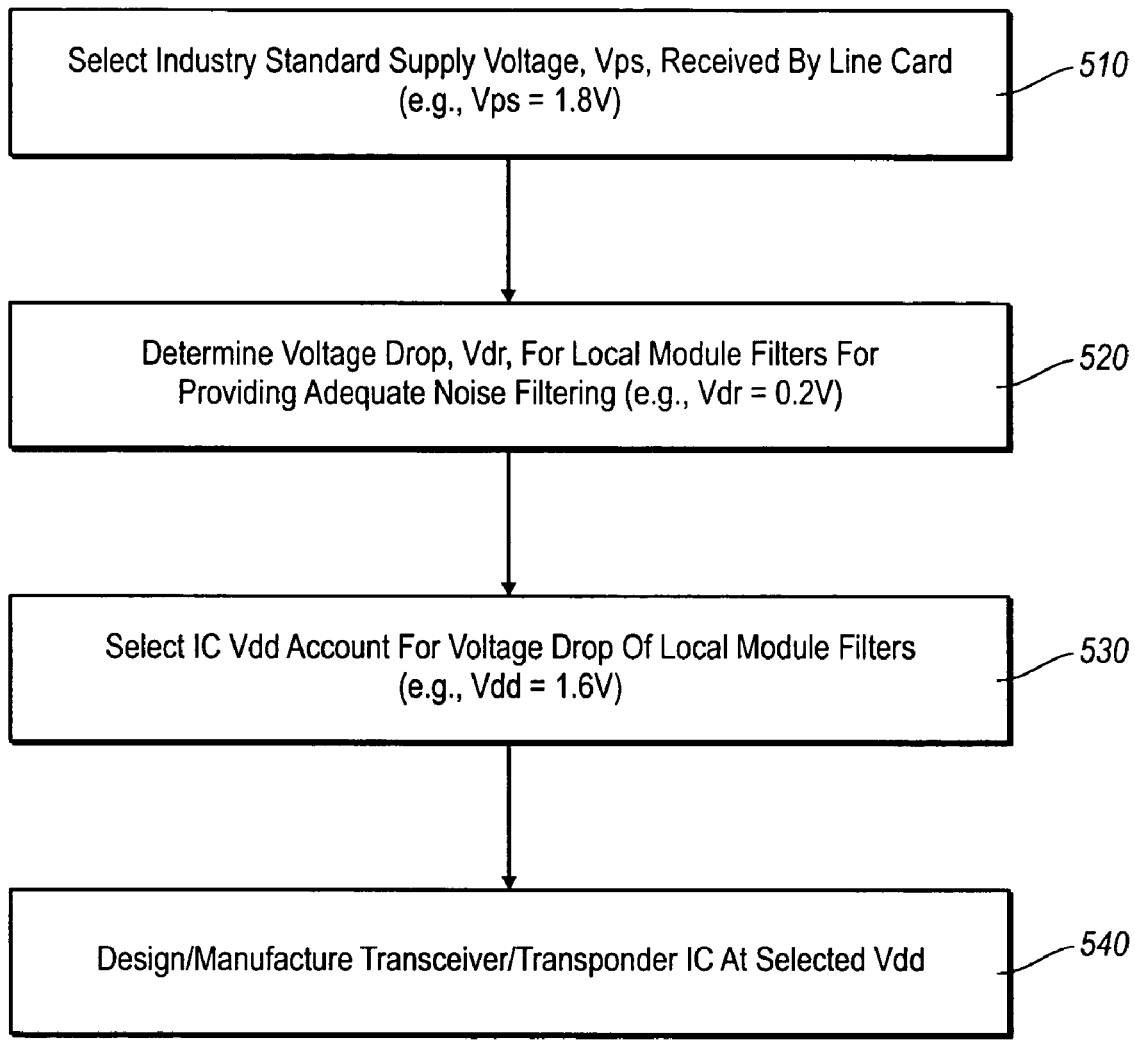
FIG. 3 illustrates a method of selecting Vdd for an IC used in a transceiver/transponder module.

FIG. 3 illustrates a general design procedure. An industry standard IC power supply voltage is selected 510, such as 1.8 volts. The voltage drop of a module filter capable of providing adequate high frequency noise filtering is determined 520. The IC on-chip operating voltage is selected 530 corresponding to a filtered voltage level. The IC is then designed 540 to operate at the filtered voltage, i.e., an application specific integrated circuit (ASIC) is designed to be operable at the filtered voltage level.

One benefit of the present invention is that designing a transceiver/transponder module to operate at a voltage less than an industry standard IC voltage permits greater flexibility in designing a module noise filter. By way of comparison, if the IC was designed to operate at the industry standard power supply voltage the local voltage filter would be constrained to have a voltage drop within the small voltage tolerance of the chip with respect to the industry standard chip voltage. In contrast, in the present invention the design constraints on the voltage are relaxed, because the IC is designed to operate at voltage level below the industry standard IC voltage.

While embodiments of the invention have been described in terms of line cards attached to a back plane, it is to be understood that other embodiments of the invention also exist. For example, the invention may be embodied in a transceiver module connectable to a computer or other device by for example a cable connector, standard industry bus (such as PCI), or by any other method. The transceiver module may also be a part of a transponder module.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A transceiver module usable in fiber-optic communication applications, the transceiver module comprising:
    a receiver optical subassembly configured to receive optical signals;
    a transmitter optical subassembly configured to transmit optical signals;
    a connector adapted to couple the transceiver to an IC voltage associated with an external power supply;
    a voltage filter adapted to receive the IC voltage from the external power supply and generate a filtered voltage at a voltage level less than the IC voltage; and
    a signal processing integrated circuit powered by the filtered voltage, the signal processing integrated circuit designed to be operated at the voltage level of the filtered voltage.

2. The transceiver module of claim 1, further comprising an LC filter coupled to the voltage filter.

3. The transceiver module of claim 1, wherein the signal processing integrated circuit is a clock and data recovery circuit.

4. The transceiver module of claim 1, wherein the signal processing integrated circuit is an eye-opening circuit.

5. The transceiver module of claim 1, wherein the voltage filter is a low-dropout linear filter.

6. The transceiver module of claim 1, wherein the voltage filter is a passive filter.

7. The transceiver module of claim 1, wherein the voltage filter is an active filter.

8. The transceiver module of claim 1, wherein the voltage filter is adapted to filter harmful noise in the range from about 10 Khz to about 3 Mhz.

9. The transceiver module of claim 1, wherein the at least one IC voltage is at least one of 1.8V, 3.3V and 5 V.

10. The transceiver module of claim 1, wherein the signal processing integrated circuit is an application specific integrated circuit.

* * * * *

UNITED STATES PATENT AND TRADEMARK OFFICE
CERTIFICATE OF CORRECTION

PATENT NO.        : 7,068,942 B2
APPLICATION NO.   : 10/684317
DATED             : June 27, 2006
INVENTOR(S)       : Hofmeister et al.

Page 1 of 1

It is certified that error appears in the above-identified patent and that said Letters Patent is hereby corrected as shown below:

Title Page
Item 54, Title, Line 3, change "TRANSCIEVER/TRANSPONDER" to
--TRANSCEIVER/TRANSPONDER--

Column 1
Line 3, change "TRANSCIEVER/TRANSPONDER" to
--TRANSCEIVER/TRANSPONDER--
Line 56, change "cause" to --caused--

Column 2
Line 14, change "power" to --powered--
Line 30, after "embodiment" insert --of the--
Line 37, after "filtered voltage" insert --at--

Column 3
Line 35, change "and" to --an--
Line 61, change "Khz" to --KHz--
Line 61, change "Mhz" to --MHz--

Column 6
Line 20, change "Khz" to --KHz--
Line 20, change "Mhz" to --MHz--

Signed and Sealed this

Nineteenth Day of August, 2008

JON W. DUDAS
*Director of the United States Patent and Trademark Office*